(12) United States Patent
Barkaro et al.

(10) Patent No.: US 7,282,992 B2
(45) Date of Patent: Oct. 16, 2007

(54) CLASS D-AMPLIFIER

(75) Inventors: Karl Stefan Barkaro, Akersberga (SE);
Bo Bokinge, Bromma (SE);
Carl-Mikael Johansson, Stockholm (SE); Lars Karlsson, Upplands Vasby (SE); Torbjorn Ivar Randahl, Nacka (SE); Andreas Wiesbauer, Portschach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/153,658

(22) Filed: Jun. 15, 2005

(65) Prior Publication Data
US 2006/0006941 A1   Jan. 12, 2006

(30) Foreign Application Priority Data
Jun. 29, 2004   (EP)   ................................. 04015202

(51) Int. Cl.
*H03F 3/217*   (2006.01)
(52) U.S. Cl. .................................. 330/251; 330/207 A
(58) Field of Classification Search .................. 330/10, 330/207 A, 251
See application file for complete search history.

(56) References Cited

U.S. PATENT DOCUMENTS

| | | | |
|---|---|---|---|
| 3,743,954 A | 7/1973 | Snedkerud | |
| 4,949,048 A | 8/1990 | Tokumo et al. | |
| 6,016,075 A * | 1/2000 | Hamo | 330/10 |
| 6,232,833 B1 * | 5/2001 | Pullen | 330/10 |
| 7,076,070 B2 * | 7/2006 | Pearce et al. | 381/120 |
| 2004/0027196 A1 | 2/2004 | Lambruschi et al. | |

FOREIGN PATENT DOCUMENTS

| | | |
|---|---|---|
| CA | 2274420 | 11/2000 |
| DE | 10228575 | 1/2004 |
| DE | 10231183 | 1/2004 |

OTHER PUBLICATIONS

European Search Report and Written Opinion dated Dec. 2004.

* cited by examiner

*Primary Examiner*—Henry Choe
(74) *Attorney, Agent, or Firm*—Jenkins, Wilson, Taylor & Hunt, P.A.

(57) ABSTRACT

A class D-amplifier which amplifies an input signal applied to an signal input of said amplifier (21) to generate an amplified signal output by an signal output (28a, 28b) of said amplifier comprising a comparator (23) which compares the applied input signal with a switch signal to generate a pulse width modulated signal; a driving unit (24) which amplifies the pulse width modulated signal to generate the amplified output signal; and a feedback circuit which generates the self oscillating switch signal for the comparator (23).

22 Claims, 7 Drawing Sheets

Class D power amplifier

CLASS D-AMPLIFIER

TECHNICAL FIELD

The invention relates to a class D-amplifier and in particular to a class D-power amplifier for amplifying an xDSL signal.

BACKGROUND ART

Digital subscriber lines (DSL) provide the key technologies in our days and help to improve the speed of communications networks. DSL offers extremely fast data transfer on existing copper-based telephone lines. In DSL, broadband data signals are transmitted on significantly higher frequencies than the traditional narrow-band telephone signals. Since both types of signals, the narrow-band telephone signals and the broad-band data signals, are transmitted over the same subscriber line, splitter devices are provided for splitting and recombining the two types of signals at both ends of the subscriber line: first at the central office or switching center, and second at the end terminals at the subscriber location.

FIG. 1 shows schematically the topology of such an telephone network coexisting with a data overlay network.

A central office CO is coupled over the subscriber lines SL1, SL2, . . . SLN to the subscribers S1, S2, . . . SN, wherein at each location splitter devices SPO, SP1, SP2, . . . SPN are provided for separating and combining the DSL broad-band and telephone narrow-band signals.

The signals generated at the central office CO and at the subscriber locations have to fulfill certain requirements. An exemplary standard for "asymmetric digital subscriber line (ADSL) transceivers provides the ITU-T Recommendation G.992.1 (06/99), series G: Transmission systems and media, digital systems and networks.

A common line code for transmitting digital data on the asymmetric digital subscriber line is provided by discrete multitone modulation (DMT). In DMT, a given frequency range for data transmission is resolved into a number of narrow-frequency bands for use as individual data links. In ADSL, data transmission occurs roughly between 20 kHz and 1 MHz.

The power spectral density (PSD) of a line code defines the distribution of the line codes power in the frequency domain. Because the frequencies used in the DSL standard must not interfere with other applications in the same frequency band, e.g. radio transmission, so-called PSD masks are introduced. A PSD mask is a template that specifies the maximum PSD allowable for a line code. PSD masks are used as guidelines for the design and implementation of a DSL technology.

FIG. 2 shows a transmit PSD mask according to the ITU-T G992.1 recommended ADSL standard.

The transmit ADSL PSD mask is piecewise continuous and requires −97.5 dBm/Hz up to 4 kHz with a maximum power in the 0-4 kHz band of 15 dB, a slope of 21 dB/octave between 4 (corresponding to −92.5 dB/Hz peak requirement) and 24.875 kHz (correponding to −36.5 dB/Hz peak requirement), −36.5 dBm/Hz between 25.875 and 1104 kHz, a negative slope of −36 dB/oct between 1104 and 3093 kHz and −90 dBm/Hz above 3093 kHz as a peak requirement (PR). Certain standards even require that the power spectral density is below −110 dBm/Hz above 4545 kHz.

Further, the maximum power in any 1 MHz wide sliding frequency window above 4545 kHz must be below −50 dBm, and the maximum transmitted total power must not be more than 19.8 dBm between 25.875 kHz and 1104 kHz.

In order to transmit the ADSL data signals over the telephone line that consists of a pair of copper wires—also named as subscriber loop or twisted pair line—the central office must be provided with line drivers. The line drivers compensate for the attenuation of lines and they have to comply with the PSD mask requirements. A line driver has to amplify the line-coded ADSL signal in a way that it is received downstream at the subscriber locations with a sufficient intensity. Similarly, line drivers should be provided at the subscriber locations for transmitting ADSL data upstream to the central office. Both line drivers need to comply with similar requirements with respect to the PSD masks given by the relevant standards.

A basic component of a line driver is a power amplifier for amplifying the DSL signal which is to be transmitted over the telephone line.

Traditionally, linear class-AB amplifiers were used. However, driving transistors in a class-AB amplifier are biased to operate in their linear region which results in that they are always in an on-state and draw precious quiescent current. This results in an inefficient power dissipation. For example, a state-of-the-art class-B line driver consumes 750 mW when transmitting 100 mW which is a power efficiency of only 13%.

The way to improve the power efficiency of a power amplifier is to operate the output transistors as switches. These amplifiers are also called class D-amplifiers. When a transistor is switched off the current through is approximately zero. When the transistor switched on, the voltage across the transistor is small, ideally zero. In each case the power dissipation is very low. This increases efficiency thus requiring less power from the power supply and smaller heat sinks for the amplifier. These are important advantages in portable battery powered equipment.

FIG. 3 shows a line driver including a class D-power amplifier according to the state of the art. Such a line driver includes a class D-power amplifier and a demodulation filter connected in series.

FIG. 4 shows a schematic of such a conventional class-D amplifier in principle.

The class-D amplifier as shown in FIG. 4 comprises a comparator CP for receiving a triangle wave signal T providing a switching frequency ($f_S$), that is generated by a triangle wave generator TG, and an input signal S1. The comparator CP compares the triangle wave signal T with the input signal S1 to create a variable duty cycle square wave signal S2. In effect, a pulse train is created with a duty cycle proportional to the input signal S1 level. This pulse width modulated signal S2 is coupled via a phase control circuit to gates of complementary output transistors P, N wherein their respective source drain paths are connected in series between a supply voltage VDD and ground GND. The amplified output signal S3 is tapped at a node between the source drain paths.

In effect, the pulse width modulated (PWM) signal with a duty cycle proportional to the input signal level turns the complementary output transistors P, N on and off at a switching frequency ($f_S$) that is much greater than the highest frequency of the input signal S1. Hence, power is sufficiently delivered from the power supply to the load.

The efficiency of the class D-amplifier as shown in FIG. 4 is high because there is little voltage drop across the switch transistors P, N during conduction. These means a very low power dissipation in the switches while virtually all the power is transferred to the load connected to the output of the class D-power amplifier. The phase control circuit receives the pulse width modulated output signal S2 of the comparator and delays signals such that the two complementary power MOSFETs P, N are not switched through at the same time. Class D-power amplifiers can reach an efficiency as high as 90%.

FIG. 5 shows a signal time diagram of the signals within a conventional class D-power amplifier as shown in FIG. 4. The comparator compares the supplied analog input signal S1 which is in the given example an analog sine wave signal. These signal is compared to a triangular signal T generated by the triangle wave generator. If the amplitude of the sine wave signal is higher than the triangular signal T a comparator supplies a low output signal to the driving stage formed by the complementary MOSFETs whereas when the amplitude of the triangular signal is higher than the applied input signal the output of the comparator CP is high. Accordingly the signal S2 supplied to the driving stage is a pulse width modulated signal PWM representing the applied input signal S1. The driving stage does not amplify the original analog input signal S1 but the digital representation, i.e. the pulse width modulated signal S2 such increasing power efficiency. As can be seen in FIG. 4 the comparator CP and the driving stage are supplied with the same supply voltage $V_{DD}$.

A further disadvantage of the class D-power amplifier as shown in FIG. 4 is that when integrated on a CMOS single chip the maximum supply voltage $V_{DD}$ is 3V so that the maximum voltage swing on the output of the class D-power amplifier is lower than 3V.

A further draw back of the class D-power amplifier as shown in FIG. 4 is that a triangle wave generator is necessary to generate the triangle wave signal T used by the comparator CP. The triangle wave generator is relative complex in structure and needs a lot of chip area when integrating a class D-power amplifier on a chip.

SUMMARY OF THE INVENTION

Accordingly it is the object of the present invention to provide a class D power amplifier which does not need a triangle wave generator and occupies a minimum area when integrating the class D-amplifier on a single chip.

This object is achieved by a class D-amplifier having the features of main claim 1.

The invention provides a class D-amplifier which amplifies an input signal applied to a signal input of that amplifier to generate an amplified signal output by a signal output of said amplifier comprising a comparator which compares the supplied input signal with a switch signal to generate a pulse width modulated signal;

a driving unit which amplifies a pulse width modulated signal to generate the amplified output signal; and a feedback circuit which generates the self oscillating switch signal for the comparator.

In a preferred embodiment the class D-amplifier according to the present invention is formed fully differential.

In a preferred embodiment the driving unit comprises at least two driving stages each including two complementary MOSFETs.

In a preferred embodiment the MOSFETs are formed in a CMOS process.

In a preferred embodiment of the class D-amplifier according to the present invention the comparator is supplied with a first supply voltage ($V_{DD1}$).

In a preferred embodiment the driving unit is supplied with a separate second supply voltage ($V_{DD2}$)

In a preferred embodiment the second supply voltage ($V_{DD2}$) is higher than the first supply voltage ($V_{DD1}$).

In a preferred embodiment of the class D-amplifier according to the present invention a phase control circuit is provided between the comparator and the driving unit to supply a phase controlled complementary pulse width modulated signal to the gate terminals of the MOSFETs of the driving stages provided within the driving unit.

In a preferred embodiment the drain terminals of the complementary MOSFETs within the driving stages of the driving unit are connected to each other and to the signal output of the class D-amplifier.

In a preferred embodiment the drain terminals of the complementary MOSFETs are extended from the gate controlled conducting channel so that the break down voltage of the respective MOSFETs is high.

In a preferred embodiment the comparator comprises a non-inverting input connected to a first input terminal of the signal input of the class D-amplifier and an inverting input connected to a second input terminal of the signal input of said class D-amplifier.

In a preferred embodiment of the class D-amplifier according to the present invention the signal output of the class D-amplifier comprises a first output terminal connected to the drain terminals of the MOSFETs of a first driving stage and a second output terminal connected to the drain terminals of the MOSFETs of the second driving stage.

In a preferred embodiment a pair of first resistors and a first capacitor are provided between the output terminals of the signal output.

In a preferred embodiment a pair of second capacitors is provided which are connected in parallel to the first capacitor and a ground terminal.

In a preferred embodiment the first output terminal is fedback via a first resistor and a second resistor of the inverting input of the comparator and the second output terminal is fedback via a first resistor and a second resistor to the non-inverting input of the comparator.

In a preferred embodiment of the class D-amplifier according to the present invention the non-inverting input and the inverting input of the comparator are connected via a pair of third resistors to a ground terminal.

In a preferred embodiment the feedback circuit is formed by the pair of first resistors, the first capacitor, the pair of second resistors, the pair of second capacitors, and the pair of third resistors.

In a preferred embodiment of the class D-amplifier according to the present invention the class D-amplifier is fully integrated on a single chip.

In a preferred embodiment of the class D-amplifier according to the present invention the input signal is an xDSL signal.

In a preferred embodiment of the class D-amplifier the generated switch signal comprises a switching frequency ($f_S$) which is higher than the highest frequency of the input signal.

In a preferred embodiment of the class D-amplifier according to the present invention a switching frequency ($f_S$) of the switching signal generated by the feedback circuit depends on a first time constant ($\tau_1$) as a product of the resistivity of the first resistor and the capacitance of the first capacitor and on a second time constant ($\tau_2$) as a product of the resistivity of the second resistor and the capacitance of the second capacitor.

In a preferred embodiment of the class D-amplifier according to the present invention the switching frequency ($f_S$) of the switch signal is adjustable.

In a preferred embodiment of the class D-amplifier according to the present invention the feedback circuit forms a self oscillating loop.

In the following preferred embodiment of the class D-amplifier according to the present invention are described with reference to the enclosed figures.

DETAILED DESCRIPTION OF THE INVENTION

Figure 6:
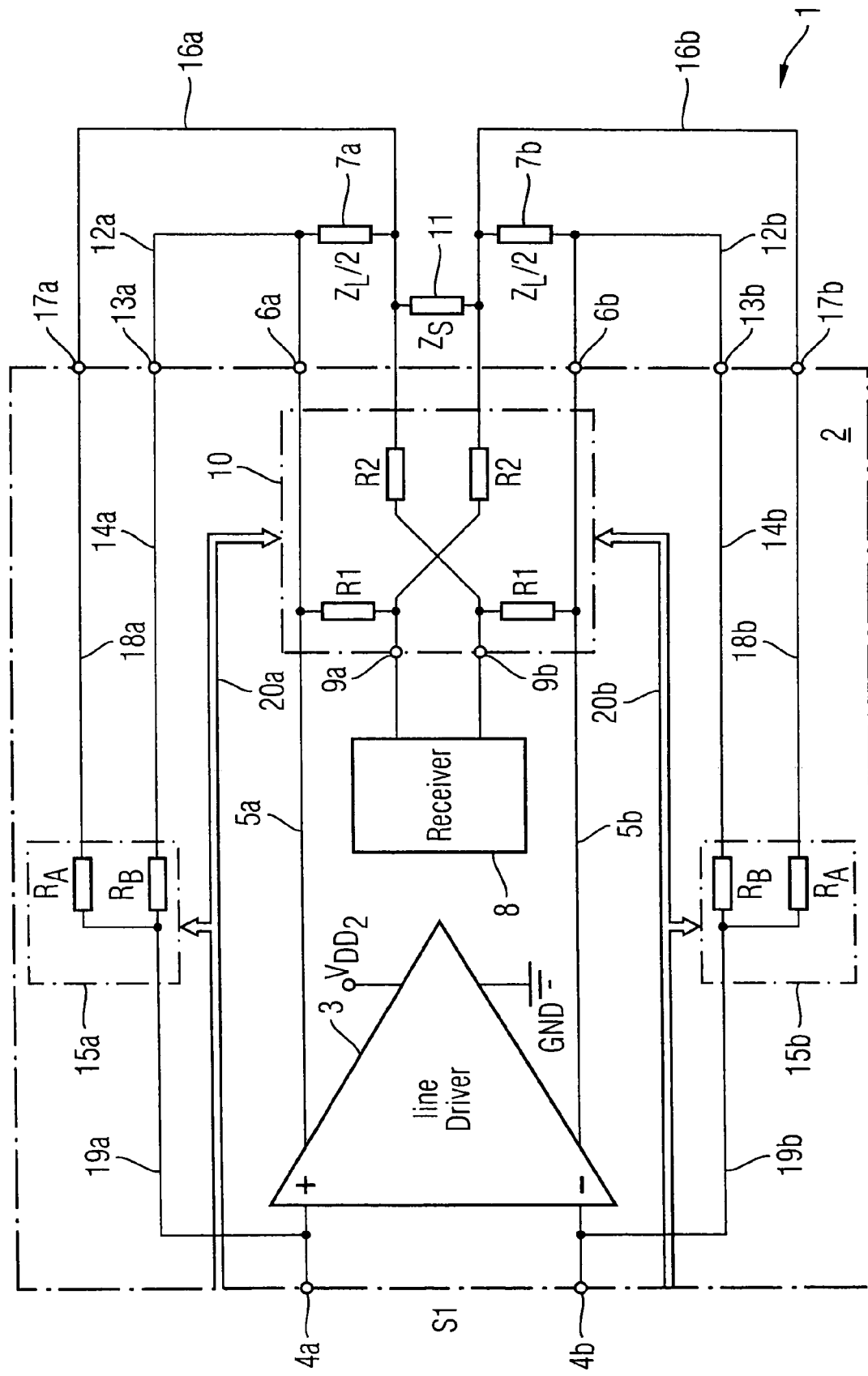
FIG. 6 shows a broadband xDSL transceiver comprising a line driver which includes a class D power amplifier according to the present invention.

As can be seen from FIG. 6 the xDSL transceiver 1 includes a line driver 3 comprising a class D-power amplifier according to the present invention. FIG. 6 shows a typical application of the class D power-amplifier for amplifying an xDSL signal within an xDSL transceiver 1.

As can be seen from FIG. 6 the broadband xDSL transceiver 1 according to the present invention comprises a xDSL transceiver chip 2 including a line driver 3 for driving a transmission signal applied to a signal input 4a, 4b of the line driver 3. The line driver 3 amplifies the applied analog signal and outputs the amplified signal via internal signal lines 5a, 5b to output terminals 6a, 6b of the xDSL transceiver chip 2. The output terminal 6a, 6b of the xDSL transceiver chip 2 are connected via a transformer not shown to the transmission line having a load impedance $Z_L$. The impedance $Z_L$ of the transmission line is complex. The transmission line is shown as impedances 7a, 7b in FIG. 6.

Figure 1:
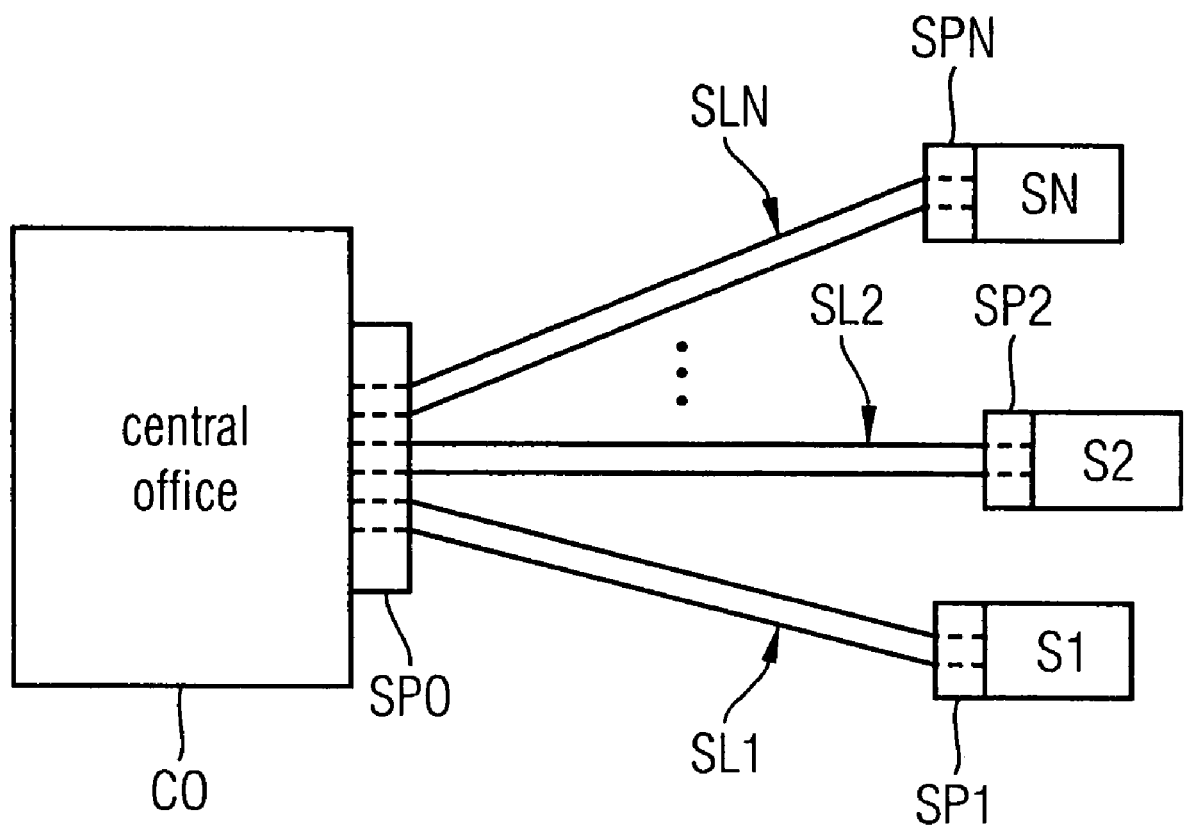
FIG. 1 shows a topology of a telephone network coexisting with a data overlay network according to the state of the art.
Figure 2:
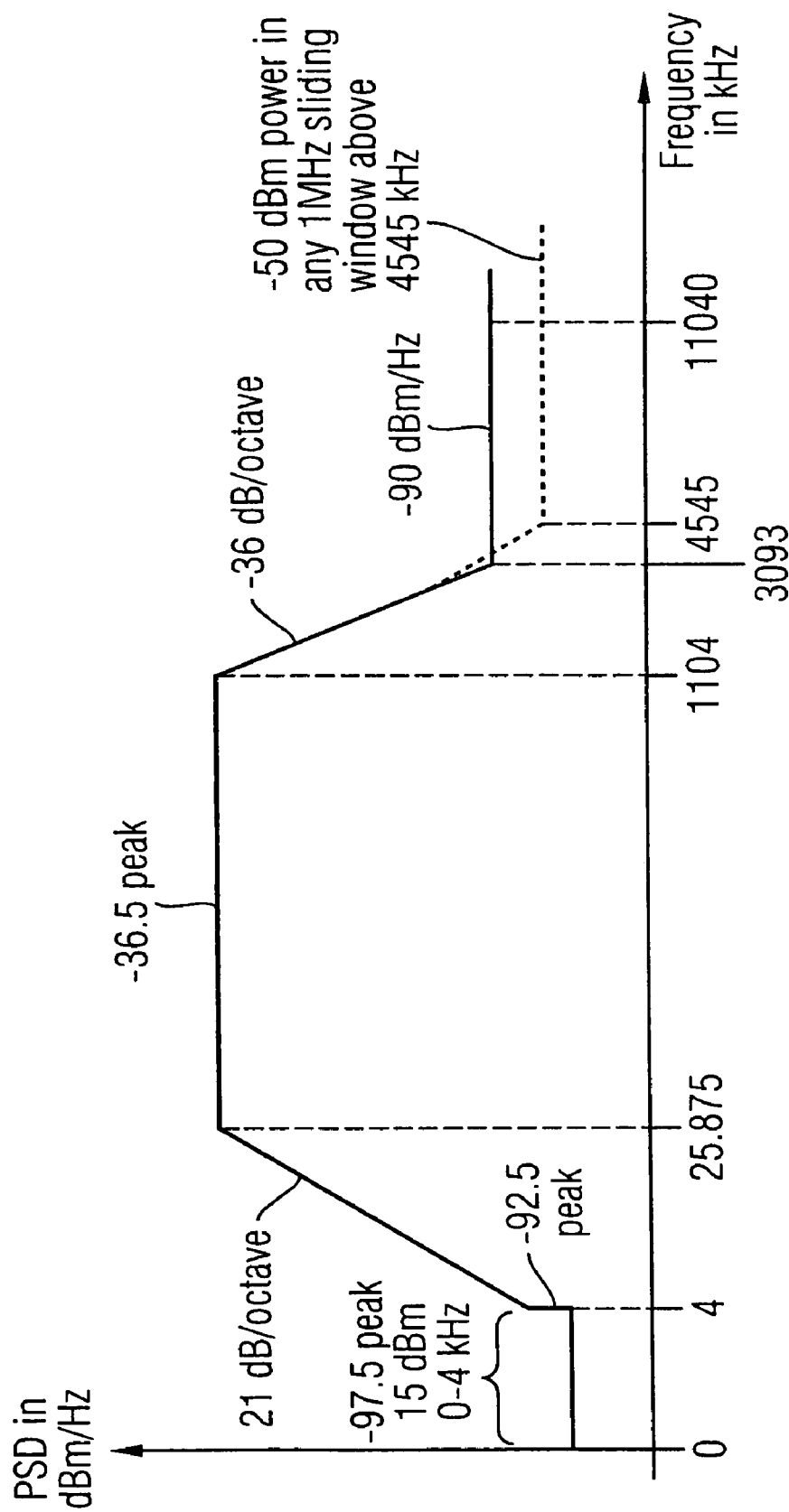
FIG. 2 shows a transmit PSD mask according to the ITU-T 6992.1 ADSL standard according to the state of the art.
Figure 3:
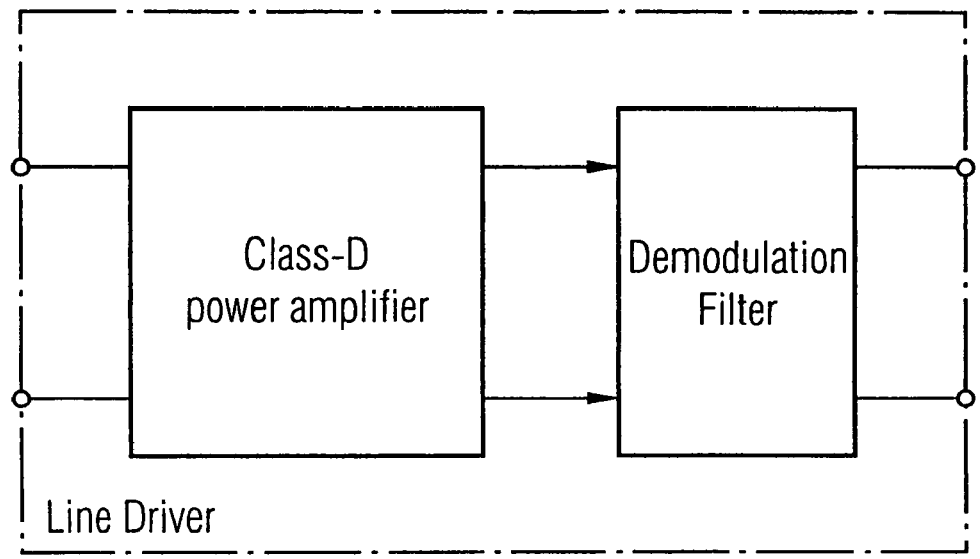
FIG. 3 shows a block diagram of a conventional line driver including a class D-power amplifier according to the state of the art.
Figure 5:
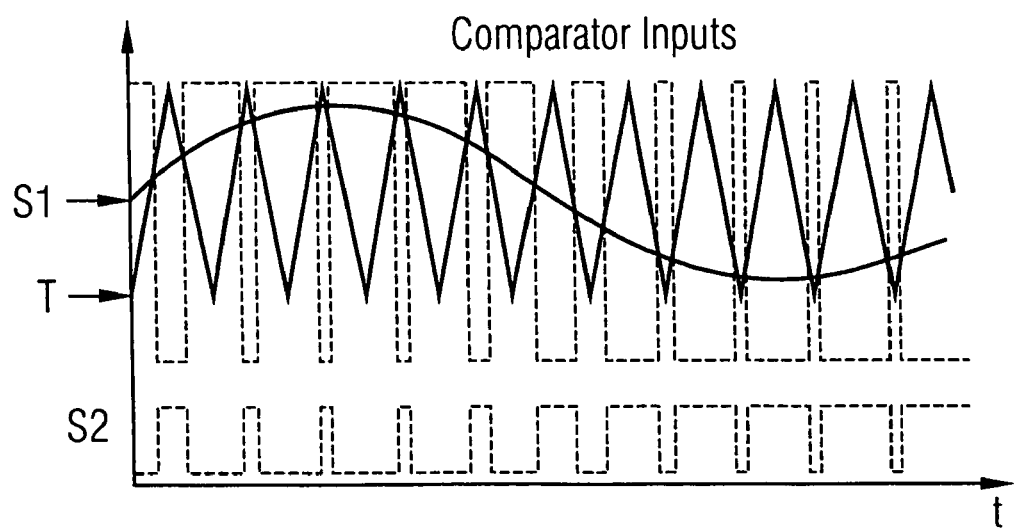
FIG. 5 shows a signal diagram to explain the functionality of a conventional class D-power amplifier as shown in FIG. 4.
Figure 4:
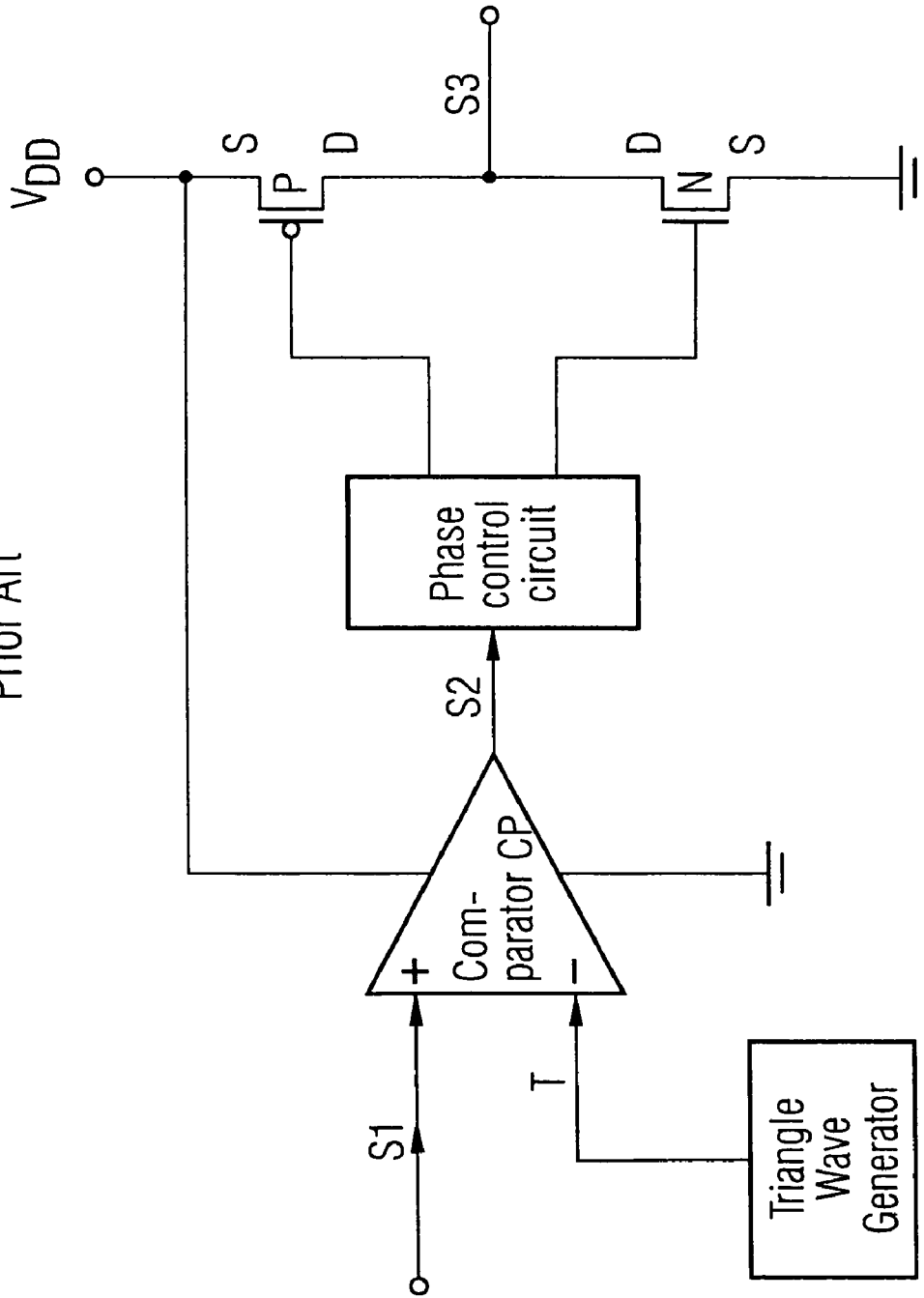
FIG. 4 shows a conventional class D-power amplifier according to the state of the art.

The xDSL transceiver 1 further comprises a receiver 8 for evaluating a reception signal received via the signal line and applied to a signal input 9a, 9b of the receiver 8. The xDSL transceiver 1 further comprises an echo canceling bridge 10 for canceling the transmission signal at the signal input 9a, 9b of the receiver 8. A sense impedance 11 is connected to the signal line. The sense impedance 11 of the xDSL transceiver 1 according to the present invention is like the impedance $Z_L$ of the transmission line also complex. The sense impedance 11 having the complex impedance $Z_S$ is in the embodiment shown in FIG. 2 not integrated in the xDSL transceiver chip 2.

The signal terminals 6a, 6b of the xDSL transceiver chip 2 are fedback via first feedback lines 12a, 12b to terminals 13a, 13b of the xDSL transceiver chip 2. The terminals 13a, 13b are connected via internal lines 14a, 14b to feedback resistor networks 15a, 15b. The sense impedance 11 of the xDSL transceiver 1 is connected via second external feedback lines 16a, 16b to terminals 17a, 17b of the xDSL transceiver chip 2. Theses terminals 17a, 17b are also connected via internal lines 18a, 18b to the feedback resistor networks 15a, 15b. The feedback resistor networks 15a, 15b each comprise at least two resistors $R_A$, $R_B$. Further the feedback resistor networks 15a, 15b include switches (not shown) so that the feedback resistance is programmable. The feedback resistor networks 15a, 15b are connected via internal feedback lines 19a, 19b to the line driver input 4a, 4b.

The echo canceling bridge 10 comprises two pairs of resistors $R_1$, $R_2$. The resistors $R_1$, $R_2$ do not have a complex impedance and are purely resistive so that they can be integrated easily on the xDSL transceiver chip 2. A first resistor $R_1$ is provided between the internal signal lines 5a, 5b and the signal input 9a, 9b of the receiver 8. The second resistor $R_2$ is connected between the complex sense impedance 11 and the signal input 9a, 9b of the receiver 8.

In a preferred embodiment the echo canceling bridge 10 is also programmable by means of internal programming control lines 20a, 20b so that the transmission signal generated by the line driver 3 at the signal input 9a, 9b of the receiver 8 is minimized. The programmable echo canceling bridge 10 comprises switches (not shown) which are controlled by means of the control lines 20a, 20b. The programming control lines 20a, 20b are connected to a microprocessor provided within the xDSL transceiver 1.

The feedback resistor networks 15a, 15b which are provided between the sense impedance 11 and the signal input 4a, 4b of the line driver 3 form a synthesized termination impedance $Z_T$ of the xDSL transceiver 1.

The termination impedance $Z_T$ of the xDSL transceiver 1 is the product of the sense impedance $Z_S$ and an adjustable impedance synthesis factor (G):

$$Z_T = G \cdot Z_S \quad (1)$$

Optimal matching is achieved when the termination impedance $Z_T$ is identical to the load impedance $Z_L$ of the signal line:

$$Z_T = Z_L \quad (2)$$

Consequently:

$$Z_L = G \cdot Z_S \quad (3)$$

The transmission gain of the transmit signal generated by the line driver 3 at the receiver input 9a, 9b is given by:

$$G_{TX} = 1 - \left[\frac{2}{1 + \frac{R_2}{R_1}}\right] \cdot \left[1 - \frac{1}{2\left(1 + \frac{Z_S}{Z_L}\right)}\right] \quad (4)$$

When the load impedance $Z_L$ is known it can be achieved that the transmission gain $G_{TX}$ becomes zero by correctly dimensioning the resistances $R_1$, $R_2$ of the resistors within the echo canceling bridge 10 and the complex impedance $Z_S$ of impedance 11.

Accordingly the echo canceling bridge 10 can be implemented in such a manner that the transmission signal is cancelled almost completely at the signal input of the receiver 8 thereby achieving a minimized crosstalk.

The gain of the reception signal $G_{RX}$ given by:

$$G_{RX} = \frac{1}{G}\left[G + \frac{1-G}{1 + \frac{R_2}{R_1}}\right] \quad (5)$$

The resistors $R_1$, $R_2$ of the echo canceling bridge are dimensioned in such a way that the gain G is minimized. The synthesis factor G is chosen to be sufficiently high to have an acceptable reception signal gain $G_{RX}$ but still low enough to achieve a low power dissipation.

When decreasing the impedance $Z_S$ thus minimizing power dissipation this has as a trade off that the gain of the reception signal $G_{RX}$ is decreased.

As can be seen from equation (4) since the sense resistor has also a complex impedance $Z_S$ like the impedance of the signal line the quotient $$\frac{Z_S}{Z_L}$$

is a constant so that $G_{TX}$ is zero for a wide frequency range. Accordingly a flat transmission gain function of the transmission signal can be achieved for all frequencies in the predetermined broadband frequency range of the xDSL transceiver 1.

Since the impedance 11 is complex ($Z_s$) it is possible in the xDSL transceiver 1 to use an echo canceling bridge 10 which is pure resistive i.e. which comprises only resistors which do not have a complex impedance. Consequently the echo canceling bridge 10 of the xDSL transceiver 1 according to the present invention can be easily integrated of the xDSL transceiver chip 2. Accordingly the xDSL transceiver 1 achieves a superior matching and minimized crosstalk at the same time.

Figure 7:
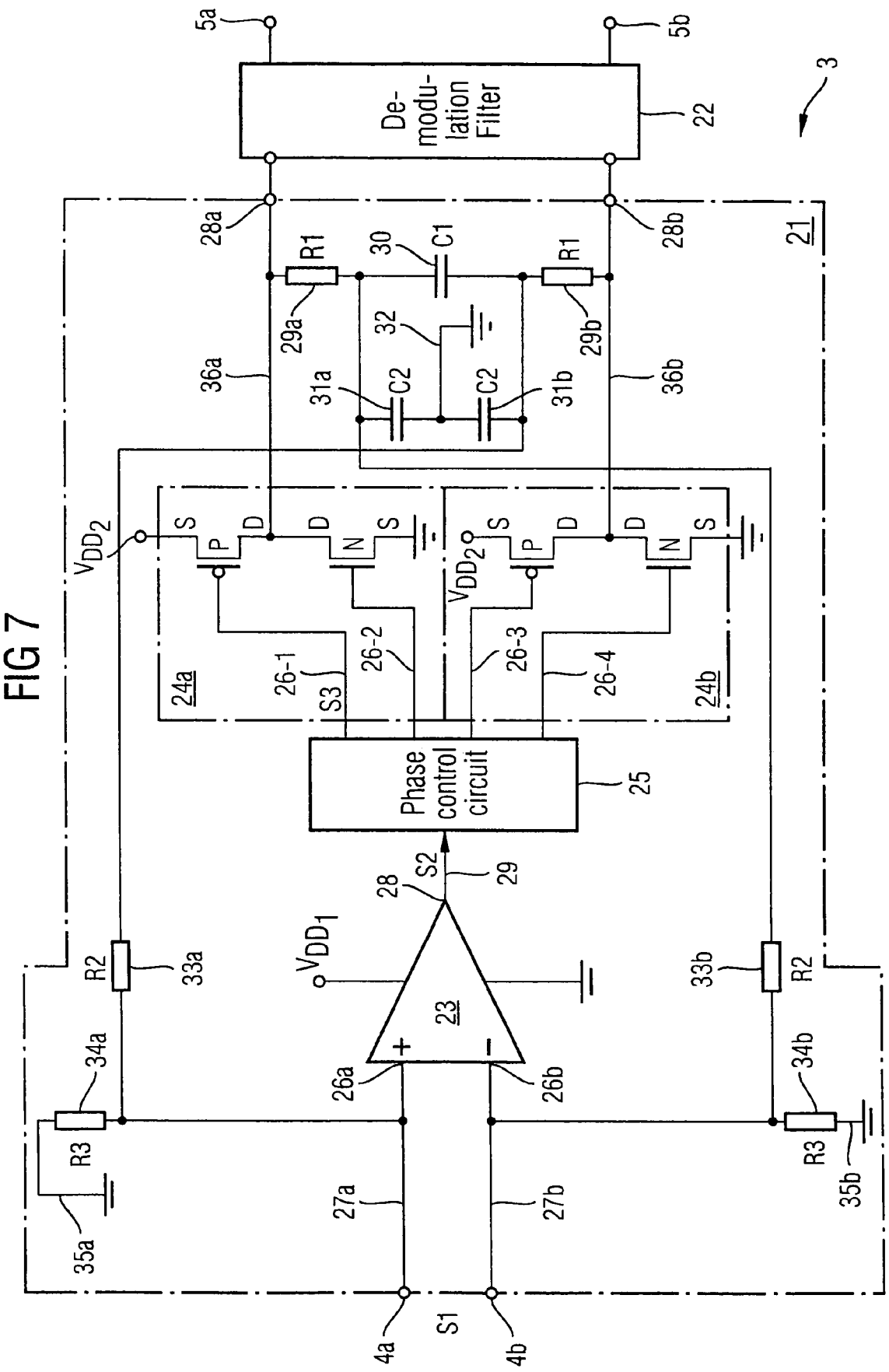
FIG. 7 shows a preferred embodiment of the class D-power amplifier according to the present invention.

FIG. 7 shows a preferred embodiment of the line driver 3 as shown in FIG. 6 including a class D-power amplifier 21 and a demodulation filter 22. The class D-power amplifier 21 is provided for amplifying the xDSL input signal S1. The demodulation filter 22 is essentially provided for low path filtering or integrating a varying pulse duty cycle into the original signal content of the applied xDSL signal S1 while attenuating (absorbing) a switching carrier frequency $f_S$. The selection of filter component values is important for maximizing the efficiency of the line driver 3. The dynamic range is attained by the selection of the switching frequency $f_s$.

As can be seen from FIG. 7 the class D-amplifier 21 comprises a comparator 23 supplied with a first supply voltage $V_{DD1}$ and a driving unit 24 supplied with a second separate supply voltage $V_{DD2}$. Between the output of the comparator 23 and the input of the driving unit 24 a phase control circuit 25 is provided. The comparator 23 comprises a non inverting input 26a and an inverting input 26b which are connected via an internal signal line 27a, 27b to the signal input 4 of the class D-amplifier 21. The signal input 4 comprises two terminals 4a, 4b. The comparator 23 further comprises an output 28 which is connected via an internal signal line 29 to an input of the phase control circuit 25. The driving unit 24 includes two driving stages 24a, 24b each including two complementary MOSFETs P, N. The phase control unit circuit 25 controls via control lines 26 the gates of the complementary MOSFET transistors within the driving stages 24a, 24b. The phase control circuit 25 is provided for avoiding that two complementary MOSFETs of the same driving stage are switched on at the same time thus causing a short circuit. The phase control unit 25 supplies phase controlled complementary pulse width modulated signals S3 to the gate terminals of the MOSFETs within the driving stages 24a, 24b. The phase control circuit 25 receives the pulse width modulated signal S2 representing the applied analog input signal S1 from the comparator output 28 via a signal line 29.

In a preferred embodiment the MOSFETs P, N within the driving stages 24a, 24b are formed in a standard CMOS process. The drain terminals D of the complementary MOSFETs P, N within a driving stage 24a, 24b are connected to each other and via lines 27a, 27b to signal output terminals 28a, 28b of the class D-power amplifier 21. The output terminals 28a, 28b form the signal output of the amplifier 21 and are connected to the demodulation filter 22. The first output terminal 28a is connected to the drain terminals of the MOSFETs P, N within the first driving stage 24a and the second output terminal 28b is connected to the drain terminal D of the MOSFETs N, P within the second driving stage 24b. Between the output terminals 28a, 28b a pair of first resistors 29a, 29b and a first capacitor 30 are provided. A pair of second capacitors 31a, 31b is connected in parallel to the first capacitor 30 and to a ground terminal 32. The first terminal 28a of the amplifier 21 is fedback via the first resistor 29a and a resistor 33b to the inverting input 26b of the comparator 23. In the same manner the second output terminal 28b of the amplifier 21 is fedback via the resistor 29b and a second resistor 33a to the non-inverting input 26a of the comparator 23. Further the non-inverting input 26a of the comparator 23 and the inverting input 26b of the comparator 23 are connected via a pair of third resistors 34a, 34b to ground terminals 35a, 35b.

As can be seen from FIG. 7 the class D-power amplifier 21 according to the present invention comprises a comparator 23 which compares the applied input signal S1 supplied to the signal input 4 to generate a pulse width modulated signal S2 supplied via the phase control circuit 25 to the gates of the MOSFETs within the driving stages 24a, 24b. The driving unit 24 comprising the driving stages 24a, 24b amplifies the pulse width modulated signal to generate the amplified output signal supplied to the demodulation filter 22.

The class D-power amplifier 21 according to the present invention as shown in FIG. 7 comprises an instable feedback circuit which generates a self oscillating switch signal for the comparator 23. The self oscillating switch signal at comparator input is a sine wave signal of e.g. 11 MHZ. The self oscillating signal is attenuated by resistors 34a, 34b, to avoid clipping at the comparator input, i.e. the amplitude of the self oscillating signal is smaller than 2 $V_{DD1}$. This feedback circuit is formed by the pair of first resistors 29a, 29b, the first capacitor 30, the pair of second resistors 33a, 33b, the pair of second capacitors 31a, 31b and the pair of third resistors 34a, 34b.

In a preferred embodiment the components of the feedback circuit are dimensioned as following:
R1=10 kilo ohm; for resistors 29a, 29b
C1=12 picofarad; for capacitor 30
C2=6 picofarad; for capacitors 31a, 31b
R2=1,5 kilo ohm; for resistors 33a, 33b
R3=10 kilo ohm; for resistors 34a, 34b.

The self oscillating switching signal generated by the feedback circuit is compared by the comparator 23 with the applied xDSL input signal to generate the pulse width modulated signal S2. The class D-amplifier 21 according to the present invention does not include a separate generator for generating a triangle wave signal for the comparator 23. The switch signal which is needed by the comparator 23 for comparison with the applied input signal is generated by the unstable self oscillating feedback loop as shown in FIG. 7. Since no separate wave generator is necessary chip area is saved when integrating the class D-amplifier 21 on a single chip.

The switching frequency ($f_S$) of the switching signal generated by the feedback circuit depends on a first time constant ($\tau_1$) and a second time constant ($\tau_2$). The first time constant ($\tau_1$) is the product of the resistivity R1 of the first resistor 29a and the capacitance (C2) of the first capacitor 30.

The second time constant ($\tau_2$) is the product of the resistivity R2 of the second resistor 33a and the capacitance (C2) of the second capacitor 33a.

In a preferred embodiment the switching frequency ($f_S$) of the class D-power amplifier 21 is adjustable by adjusting the capacitance and resistivities of the respective resistors and capacitors within the feedback circuit.

In a preferred embodiment the class D-amplifier 21 and the demodulation filter 22 are integrated on a single chip to form a fully integrated line driver 3.

As can be seen in FIG. 7 the comparator 23 and the driving unit 24 are supplied with separate supply voltages ($V_{DD1}$), ($V_{DD2}$). In a preferred embodiment the supply voltage ($V_{DD2}$) of the driving unit 24 is significantly higher than the supply voltage ($V_{DD1}$) of the comparator 23. This has the advantage that the output voltage swing of the amplified signal is higher to meet specific requirements set by the xDSL standard. In a typical embodiment is the supply voltage ($V_{DD1}$) for the comparator 23 is 3V and the supply voltage ($V_{DD2}$) for the driving stage is 10V. As can be achieved by increasing the breakdown voltage of the MOSFETs P, N within the driving stages 24a, 24b.

Figure 8:
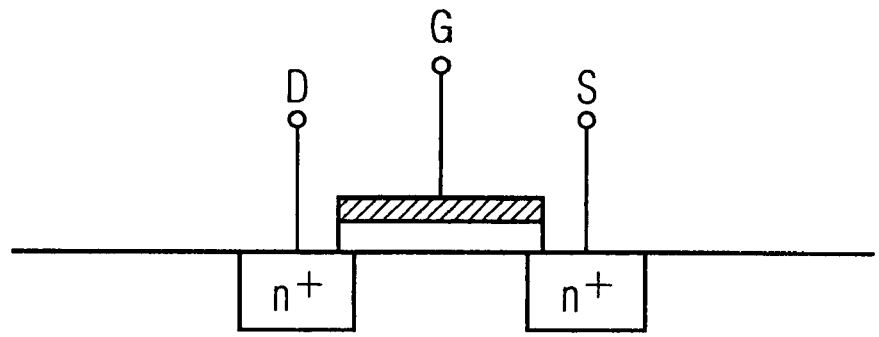
FIG. 8 shows a cross section of a conventional power MOSFET.

FIG. 8 shows a cross section to a N-channel NMOS transistor according to the state of the art which is manufactured in a standard CMOS process.

Figure 9:
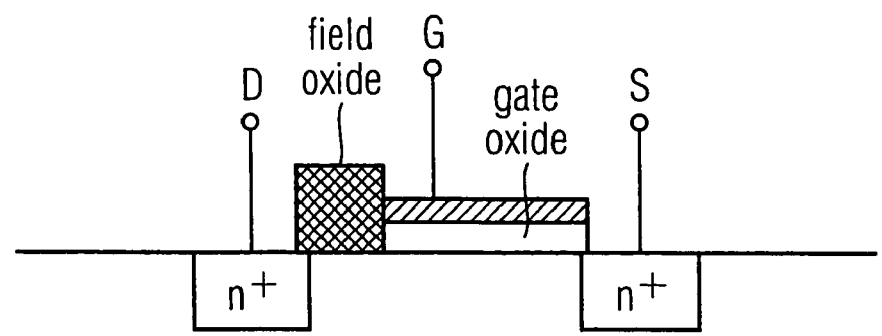
FIG. 9 shows a cross section of a power MOSFET as employed in the driving stage of a preferred embodiment of the class D-power amplifier according to the present invention.

FIG. 9 shows a cross section through an NMOS as employed in the driving stages 24a, 24b with an increased breakdown voltage. By increasing the distance between the edge of the gate oxide and the drain diffusion the breakdown voltage $U_{DS}$ of the NMOS is increased considerably up to 12V. The same is applied to the PMOS within the preferred embodiment of the driving stages 24a, 24b. By increasing the breakdown voltages of the NMOS and PMOS of the driving unit 24 it is possible to increase the supply voltage ($V_{DD2}$) of the driving unit 24. Consequently the possible signal swing at the signal output of the power amplifier 21 is increased. The MOSFETs N, P are produced in a preferred embodiment in standard CMOS process.

REFERENCE LIST 1 xDSL transceiver
2 xDSL transceiver chip
3 line driver
4 signal input
5 internal line
6 transceiver terminal
7 load impedance
8 receiver
9 receiver input
10 echo canceling bridge
11 sense impedance
12 feedback line
13 terminal
14 internal line
15 feedback resistor network
16 feedback line
17 terminal
18 internal line
19 internal line
20 programming control lines
21 class D-power amplifier
22 demodulation filter
23 comparator
24a, 24b driving stages
25 phase control circuit
26 control line
26a, 26b operator input
27a, 27b input signal lines
28 comparator output
28a, 28b output terminals
29 signal line
29a, 29b resistors
30 capacitor
31a, 31b capacitors
32 ground terminal
33a, 33b resistors
34a, 34b resistors
35a, 35b ground terminals
36a, 36b output signal lines

What is claimed is:

1. A class D-amplifier which amplifies an input signal applied to an signal input of said amplifier to generate an amplified signal output by an signal output of said amplifier comprising:
   (a) a comparator for comparing the applied input signal with a switch signal to generate a pulse width modulated signal;
   (b) a driving unit for amplifying the pulse width modulated signal to generate the amplified output signal, wherein the driving unit comprises at least two driving stages each including two complementary MOSFETs; and
   (c) a feedback circuit for generating the self oscillating switch signal for the comparator.

2. The class D-amplifier according to claim 1 wherein the class D-amplifier is formed fully differential.

3. The class D-amplifier according to claim 1 wherein the MOSFETs are formed in a CMOS process.

4. The class D-amplifier according to claim 1 wherein the comparator is supplied with a first supply voltage.

5. The class D-amplifier according to claim 1 wherein the driving unit is supplied with a separate second supply voltage.

6. The class D-amplifier according to claim 5 wherein the second supply voltage Is higher than the first supply voltage.

7. The class D-amplifier according to claim 1 wherein a phase control circuit is provided between the comparator and the driving unit to supply phase controlled complementary pulse width modulated signals to the gate terminals of the MOSFETs of the driving stages provided within the driving unit.

8. The class D-amplifier according to claim 7 wherein the drain-terminals of the complementary MOSFETs within the driving stages of the driving unit are connected to each other and to the signal output of said class D amplifier.

9. The class D-amplifier according to claim 8 wherein the drain-terminals of the complementary MOSFETs are extended from the gate controlled conducting channels of the MOSFETs, so that the breakdown voltage of the respective MOSFETs is high.

10. The class D-amplifier according to claim 1 wherein the comparator comprises a non inverting input connected to a first input terminal of the signal input of said class D-amplifier and an inverting input connected to a second input terminal of the signal input of said class D-amplifier.

11. The class D-amplifier according to claim 1 wherein the signal output of said class D-amplifier comprises a first output terminal connected to the drain terminals of the MOSFETs of a first driving stage and a second output terminal connected to the drain terminals of the MOSFETs of a second driving stage.

12. The class D-amplifier according to claim 11 wherein between the output terminals of the signal output a pair of first resistors and a first capacitor are provided.

13. The class D-amplifier according to claim 12 wherein a pair of second capacitors is provided which are connected in parallel to the first capacitor and a ground terminal.

14. The class D-amplifier according to claim 12 wherein the first output terminal is fedback via a first resistor and a second resistor to the inverting input of the comparator and the second output terminal is fedback via a first resistor and a second resistor to the non inverting input of the comparator.

15. The class D-amplifier according to claim 14 wherein the non inverting input and the inverting input of the comparator are connected via a pair of third resistors to a ground terminal.

16. The class D-amplifier according to claim 12 wherein the feedback circuit is formed by:
(a) the pair of first resistors,
(b) the first capacitor,
(c) the pair of second resistors,
(d) the pair of second capacitors, and
(e) the pair of third resistors.

17. The class D-amplifier according to claim 1 wherein the class D-amplifier is fully integrated.

18. The class D-amplifier according to claim 1 wherein the input signal is an xDSL signal.

19. The class D-amplifier according to claim 1 wherein the generated switch signal comprises a switching frequency which is higher than the highest frequency of the input signal.

20. The class D-amplifier according to claim 19 wherein the switching frequency of the switching signal generated by the feedback circuit depends on a first time constant as a product of the resistivity of a first resistor and the capacitance of a first capacitor and on a second time constant as a product of the resistivity of a second resistor and the capacitance of a second capacitor.

21. The class D-amplifier according to claim 20 wherein the switching frequency of the switch signal is adjustable.

22. The class D-amplifier according to claim 1 wherein the feedback circuit forms a self oscillating loop.

* * * * *